United States Patent [19]

De La Moneda

[11] 4,072,545
[45] Feb. 7, 1978

[54] RAISED SOURCE AND DRAIN IGFET DEVICE FABRICATION

[75] Inventor: Francisco H. De La Moneda, Reston, Va.

[73] Assignee: International Business Machines Corporation, Armonk, N.Y.

[21] Appl. No.: 688,811

[22] Filed: May 21, 1976

Related U.S. Application Data

[62] Division of Ser. No. 529,193, Dec. 3, 1974, Pat. No. 4,016,587.

[51] Int. Cl.² .......................................... H01L 21/265
[52] U.S. Cl. ..................................... 148/187; 148/1.5; 29/571; 156/643; 156/649; 156/657; 156/662
[58] Field of Search .................. 156/7, 8, 17, 11, 643, 156/649, 657, 662, 600; 29/571, 579, 580, 591, 576 E; 148/1.5, 174, 175, 187; 357/23, 59; 427/93

[56] References Cited

U.S. PATENT DOCUMENTS

| | | | |
|---|---|---|---|
| 3,652,905 | 10/1972 | Page et al. | 357/11 |
| 3,674,551 | 7/1972 | Athanas | 156/11 |
| 3,699,646 | 10/1972 | Vadasz | 29/571 |
| 3,750,268 | 8/1973 | Wang | 29/571 |
| 3,764,413 | 10/1973 | Kakizaki et al. | 148/187 |
| 3,895,390 | 7/1975 | Meiling et al. | 357/23 |
| 3,940,288 | 2/1976 | Takagi et al. | 148/1.5 |
| 3,996,657 | 12/1976 | Simko et al. | 357/23 |

OTHER PUBLICATIONS

Iwamatsu et al. "A New Isolation Structure for High Density LSI" International Electron Device Conference, Wash., D. C. (12/19/73), pp. 244-247.

*Primary Examiner*—Charles L. Van Horn
*Assistant Examiner*—Jeromeu Massie
*Attorney, Agent, or Firm*—John E. Hoel

[57] ABSTRACT

Disclosed is an integrated circuit field effect transistor having a source and drain which protrude above the silicon substrate so as to create shallow junctions with the substrate while maintaining a relatively low sheet resistivity in the region. Two self-aligned source and drain fabrication processes are disclosed for the device. The first process yields a polysilicon field shield and the second process yields a field region composed of thermal silicon dioxide.

8 Claims, 27 Drawing Figures

MASK 1

RAISED SOURCE AND DRAIN IGFET DEVICE FABRICATION

This is a division, of application Ser. No. 529,193 filed Dec. 3, 1974, now U.S. Pat. No. 4,016,587.

FIELD OF THE INVENTION

This invention relates to MOS devices and processes for making same.

BACKGROUND OF THE INVENTION

In order to achieve higher circuit speed and density in integrated circuit field effect transistors, it is necessary to reduce both the horizontal and the vertical dimensions of the device. Experimental and analytical evidence indicates that the threshold voltage, $V_T$, of IGFET's falls sharply as the source-drain spacing is reduced. Studies for example by F. H. De La Moneda, "Threshold Voltage from Numerical Solution of the Two Dimensional MOS Transistor", IEEE Transaction on Circuit Theory, Vol. CT-20, pages 666–673, Nov. 1973, show that in order to avoid this drop, it is necessary to compensate by scaling down both the horizontal and the vertical dimensions of the device for example by reducing the thickness of the gate oxide and the junction depth and, in addition, by scaling up the substrate doping level by some factor. However, reductions in gate oxide thickness and increased substrate doping have adverse side effects. It is well known that reduced oxide thicknesses diminish the reliability of the device. The threshold voltage and the junction capacitance increase with the square root of the doping concentration and therefore devices with increased doping concentration become impractical for faster circuit applications. In view of this, it is necessary to use high resistivity substrates for the formation of the smaller IGFET device and then later adjust the device parameters to reduce the detrimental influence of a high resistivity substrate on the threshold voltage. Such adjustments include ion implantation of the substrate, reduction of the oxide thickness, and reduction of the junction depth to the extent that such reduction is possible with conventional device fabrication processes. Conventional processes for fabricating insulated gate field effect transistors determine the junction depth by the initial drive-in cycle and subsequent heat cycles associated with oxidation steps. These conventional device fabrication processes are not capable of producing very shallow source and drain junctions necessary for IGFET's of reduced size.

OBJECTS OF THE INVENTION

It is an object of the invention to make an IGFET device in an improved manner.

It is another object of the invention to make an IGFET device having a high circuit speed and density in an improved manner.

It is still another object of the invention to make an IGFET device having high circuit speed and density with a reduced source and drain junction depth, in an improved manner.

It is still a further object of the invention to make an IGFET device having an improved contact to a very shallow junction source and drain.

SUMMARY OF THE INVENTION

An integrated circuit field effect transistor device is disclosed which has as its source and drain, epitaxial regions which are grown from the surface of the silicon substrate so as to protrude above same. The source and drain regions serve as low resistivity contacts and have very shallow junctions in the substrate region.

The reduced junction depth allows the device designer to reduce the channel length of the IGFET device without requiring a compensatory reduction of the gate oxide thickness and/or an increase in the substrate doping concentration.

Two self-aligned source and drain device fabrication processes are disclosed. The first process yields a polysilicon field shield simultaneously with the growth of the epitaxial source and drain protrusions and the polysilicon gate region. The second process produces a field region composed of thermal silicon dioxide.

DESCRIPTION OF THE DRAWINGS

The foregoing and other objects, features and advantages of the invention will be apparent from the following more particular description of the preferred embodiments of the invention, as illustrated in the accompanying drawings.

FIG. 1J shows a cross sectional view of a completed IGFET device invention.

FIG. 2P is a cross sectional view of a completed IGFET device with the thermal oxide in the field region.

DISCUSSION OF THE PREFERRED EMBODIMENT

Polysilicon Field Shield Process

The process for fabricating the protruding source and drain IGFET device with a polysilicon field shield is illustrated in FIGS. 1A through 1J. An N-channel process will be used for illustrative purposes, however, the process is equally amenable to the production of P-channel devices.

Figure 1A:
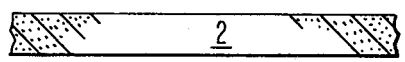
FIGS. 1A through 1K illustrate the sequence of operative steps necessary to fabricate the protruding source and drain IGFET device with a polysilicon field shield.

FIG. 1A illustrates the starting wafer 2 of crystalline silicon having a background doping level of $10^{15}$ impurities per $cm^3$.

Figure 1B:
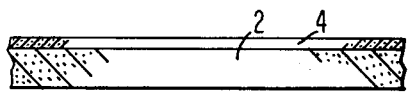

FIG. 1B illustrates the first step in processing the silicon wafer 2 where the thermal silicon dioxide layer 4 is grown thereon to a thickness in the range of $500 \times 10^{-8}$ cm.

Figure 1C:

FIG. 1C illustrates the first masking step wherein the silicon dioxide layer 4 is masked by a photoresist and the window regions 3 and 5 are etched from the silicon dioxide layer 4 exposing the wafer surface 2, by suitable photolithographic methods.

Figure 1D:
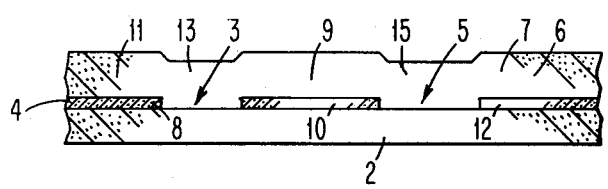

FIG. 1D illustrates the steps of growing the epitaxial and polycrystalline silicon layer 6 on the surface of the silicon dioxide layer 4 and the exposed areas of the silicon wafer 2. Those regions above the silicon dioxide layer 4 become polycrystalline silicon and those regions above the windows 3 and 5 become epitaxial layers of silicon having a crystalline orientation equal to that of the wafer 2. The polysilicon portions 7, 9 and 11 have a thickness of $1\mu$ and the epitaxial regions above the windows 3 and 5 have a thickness of $1\mu$. The polysilicon layer regions 7 and 11 will form the polysilicon field shield in the finished device and the polysilicon layer region 9 will form the polysilicon gate region in the finished device. The epitaxial silicon region 13 above the window 3 will serve as the source and the region 15 above the window 5 will serve as the drain for the completed IGFET device.

Figure 1E:
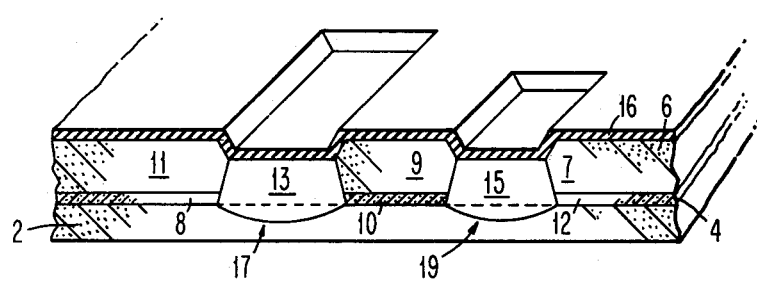
Figure 1F:
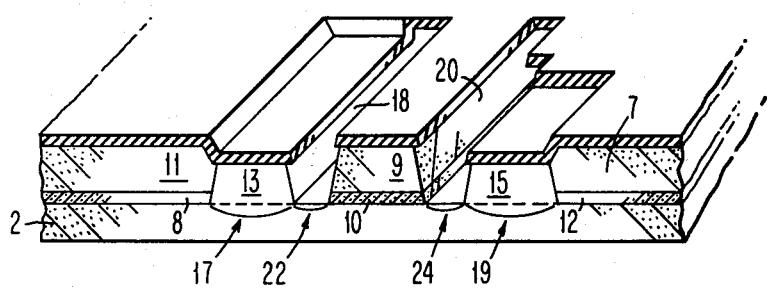

FIG. 1E illustrates the step of depositing a silicon nitride layer 16 over the entire surface of the polysilicon/epitaxial silicon layer 6. FIG. 1E further illustrates the second masking step of etching out the region 18 and 20 around the polysilicon gate region 9 and the gate oxide 10 using a suitable etchant such as a suitable mixture of hydroflouric and nitric acids.

A shallow N+ conductive layer 22 and 24 can be formed between the self-aligned gate region 9 and the source 13 and drain 15 epitaxial contacts by means of ion implantation or diffusion of for example phosphorus.

Figure 1G:
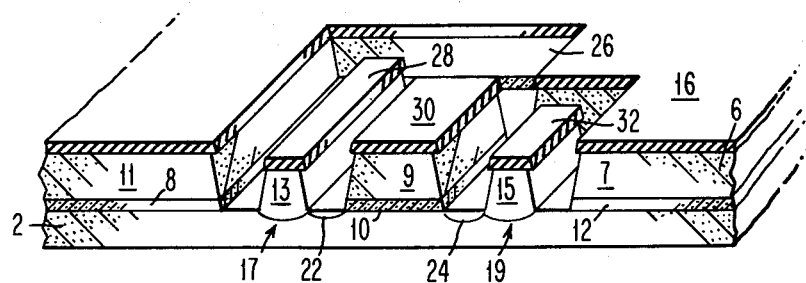

FIG. 1G illustrates the use of a third mask to permit the etching out of a moat region 26 extending from the surface of the nitride layer 16 down to the surface of the silicon substrate 2, thereby defining nitride layer 28 on top of the source projection 13, nitride layer 30 on top of the polysilicon gate 9, and nitride layer 32 on top of the epitaxial drain protrusion 15. Thus the polysilicon gate 9, the source protrusion 13, and the drain protrusion 15 are electrically isolated from the polysilicon field shield region which is comprised of the portions 7 and 11 of the polysilicon layer 6 which surround the device.

Figure 1J:
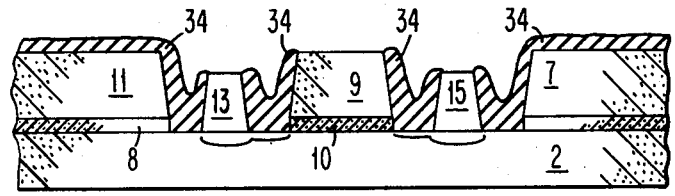
Figure 1H:
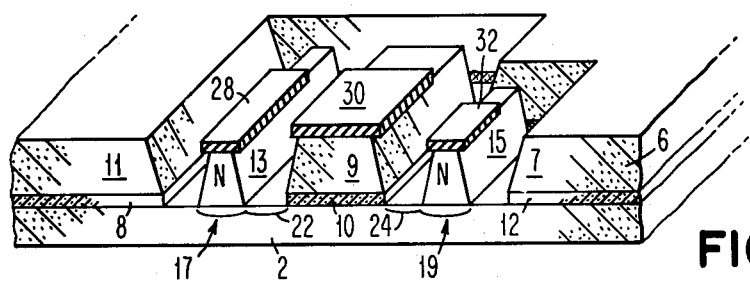

FIG. 1H illustrates the use of a fourth mask to locate the self-aligned contacts to the drain protrusion 15, the source protrusion 13, and the gate 9 of the device. The nitride layer 16 is removed except for the regions 28, 30 and 32.

Figure 1I:
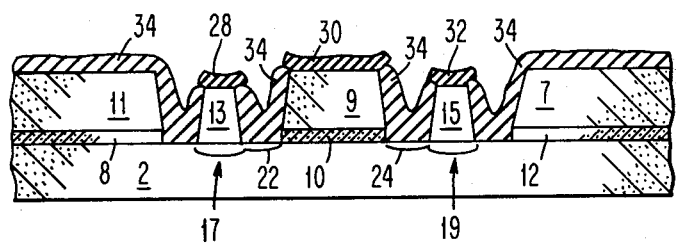

FIG. 1I illustrates the step of growing a silicon dioxide layer over all exposed silicon surfaces to insure that the gate 9, the source 13, and the drain 15 are electrically isolated from the field shield 7 and 11 and from each other. Since the oxide growth should not be more than 1500A, this heat cycle will not drive impurities from the epitaxial layer 13 and 15 and the ion implanted junctions 22 and 24 substantially deeper into the substrate 2. In the region of the substrate 2 immediately next to the gate 9, the doping concentration is controlled by the ion implantation step shown in FIG. 1F and does not need to be as high as that of the epitaxial layer 6 whose sheet resistivity must be as low as is possible. Therefore the junctions for the implanted regions 22 and 24 are shallower at their boundaries adjacent to the gate than are the junctions 17 and 19 underneath the epitaxial source 13 and drain 15 layers, respectively.

FIG. 1J dip etch with a suitable etchant such as hot phosphoric acid is now employed to remove the nitride layers 28, 30 and 32 so as to form the self-aligned contact regions for the source 13, gate 9, and drain 15 regions, respectively. A layer of aluminum is then deposited upon all exposed surfaces of the configuration shown in FIG. 1I.

Figure 1K:
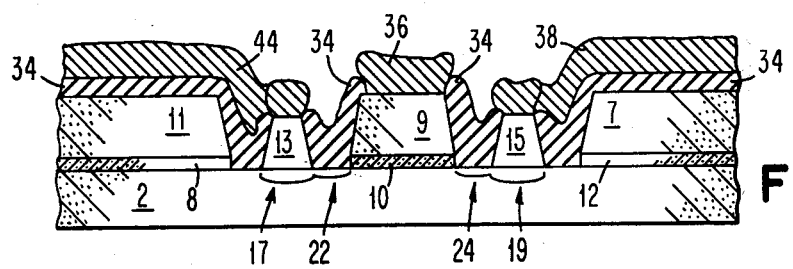

FIG. 1K shows the IGFET device after the use of mask number 5 to define the aluminum interconnection pattern. The etching step delineates the source contact 44 for the source protrusion 13, the gate contact 36 for the polysilicon gate 9, and the drain contact 38 for the drain protrusion 15.

Note that the vertical elevation of the silicon source contact 13 and silicon drain contact 15 are not to scale. The difference in the elevation between the interface of silicon contact 13 and metal 44 and the elevation of the upper surface of polysilicon field shield 11 is approximately equal to the thickness of the gate oxide 10. Thus, the top surface of the finished device is almost planar, which is very desirable for projection printing.

This process has the advantage of decoupling the fabrication of the source junction 22 and the drain junction 24 from their respective conductive interconnections 13 and 15 by using ion implantation for the formation of the self-aligned junctions 22 and 24 and epitaxial deposition for the source protrusion 13 and drain protrusion 15. It is therefore possible to fabricate junctions and interconnections whose parameters are individually tailored for best device performance. The junctions are very shallow and have low junction capacitance while the interconnections have low sheet resistivity, low isolation capacitance, and are deep enough for reliable metallurgy.

Process for Fabricating IGFET Device with Thermal Oxide Field Region

Where the device application requires a field oxide instead of a polysilicon field shield, the following process will be useful.

Figure 2A:
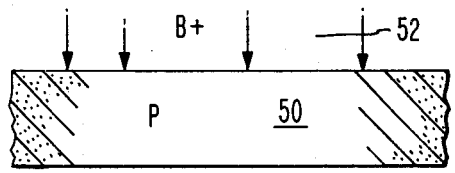
FIGS. 2A through 2P illustrate the sequence of operative steps necessary to fabricate the protruding source and drain IGFET device with thermal oxide in the field region.

FIG. 2A shows the starting wafer 50 of crystalline silicon having a P type background doping of $10^{15}$ impurities per $cm^3$. A blanket boron implantation 52 can be made at this time to avoid inversion layers between devices.

Figure 2B:
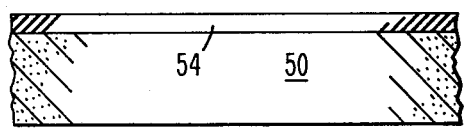

FIG. 2B illustrates the step of depositing a silicon nitride layer 54 on top of the semiconductor substrate 50.

Figure 2C:
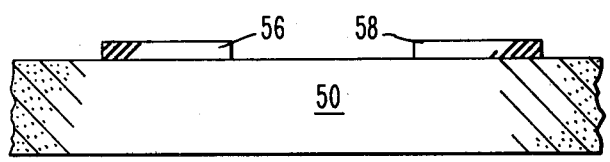

FIG. 2C illustrates the use of a first mask to delineate the source window by means of the nitride mask 56 and the drain window by means of the nitride mask 58 which are left after the etching process.

Figure 2D:
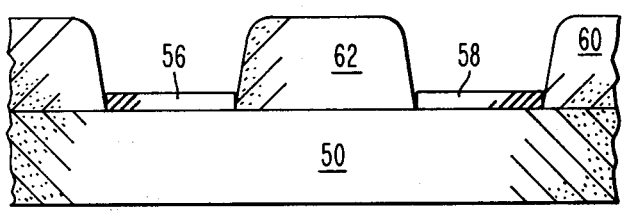

FIG. 2D illustrates the step of growing the field oxide layer 60 over all exposed regions of the silicon wafer 50. The nitride mask 56 and 58 prevents the growth of oxide at the source and drain windows.

Figure 2E:
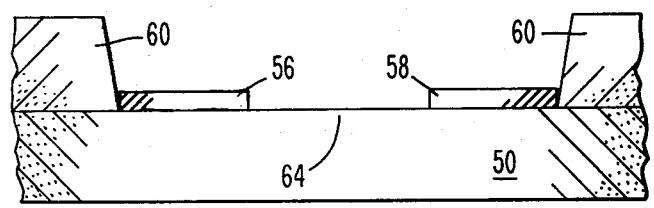

FIG. 2E illustrates the step of using a second mask to define the gate area between the nitride mask 56 and 58. The alignment of the second mask is not critical since the objective is to remove the portion 62 of the oxide layer 60 which is separated from the field portion of the oxide layer 60 by the width of the nitride mask 56 and 58. The etching and removal of the oxide portion 62 leaves the gate region 64 of the wafer surface 50 exposed. If the threshold voltage of the resulting device is to be adjusted using ion implantation, the photolithographic mask number 2 can also be used to block out the implantation from the field regions 60.

Figure 2F:
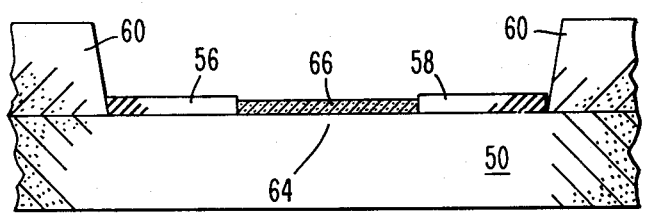

FIG. 2F shows the next step of growing a thin oxide 66 in the gate region 64.

Figure 2G:
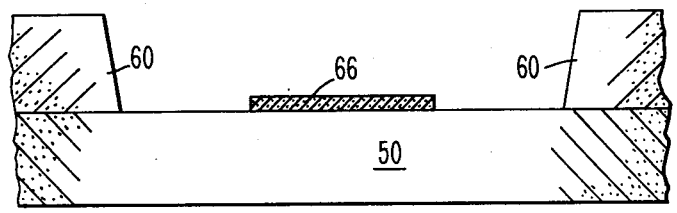

FIG. 2G illustrates the next step of dip etching to remove the nitride mask layers 56 and 58 from the surface of the wafer 50.

Figure 2H:
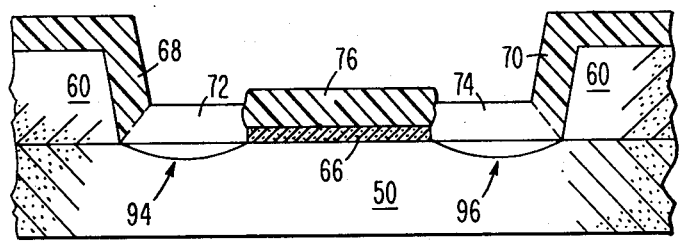

FIG. 2H illustrates the next step of growing a layer of epitaxial silicon over all exposed surfaces. The silicon layer will be epitaxial in the source region 72 and the drain region 74 since it is formed over the exposed areas of the monocrystalline silicon substrate 50. The silicon layer will be in the polycrystalline phase in the region 68 and 70 over the field oxide region 60 and in the region 76 over the gate oxide layer 66. The polysilicon layer 68 will ultimately be the electrical contact to the source region 72 and the polysilicon region 70 will ultimately be the contact to the drain region 74. The polysilicon layer 76 will ultimately be the conductive gate electrode for the IGFET device.

Figure 2I:
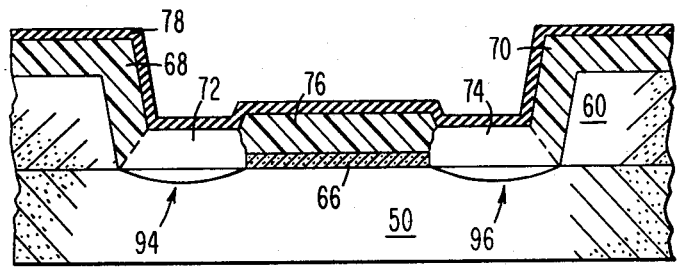

FIG. 2I illustrates the next step of depositing a nitride layer 78 over all exposed surfaces of silicon.

Figure 2J:
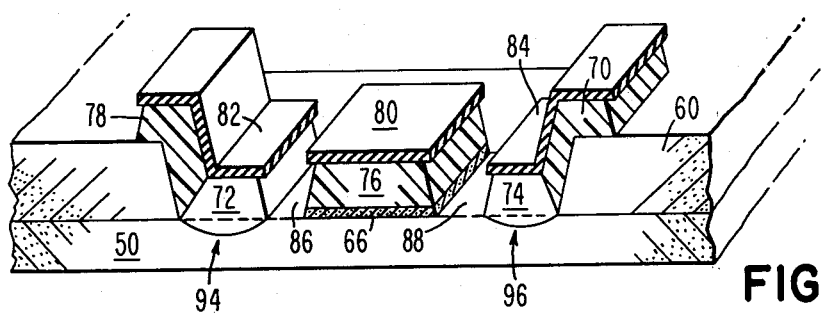

FIG. 2J illustrates the use of mask three to etch the nitride and polysilicon so as to isolate the protruding source 72 and nitride layer 82 from the gate oxide 66, polysilicon gate region 76, and nitride layer 80 by the region 86. Mask number three also separates the protruding drain region 74 and nitride layer 84 from the gate oxide 66, the polysilicon gate region 76, and the nitride layer 80 by the region 88. Two choices are available for the configuration of the gate electrode. A moat similar to the one described in FIG. 1G can be etched around the gate polysilicon 76 as is shown in FIG. 2J or, as an alternative, the polysilicon region 76 for the gate can be extended out over the field oxide region as a gate contact. Although this second alternative consumes more silicon area, it offers an easier metallurgy configuration.

Figure 2K:
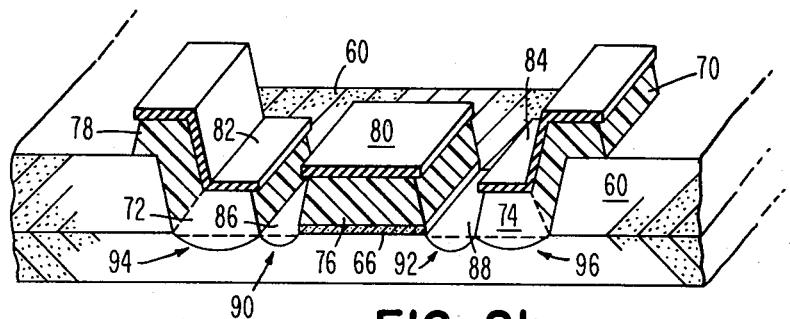

FIG. 2K illustrates the next step which is the implantation of phosphorus in the region 86 to self-align the source electrode 72 with the edge of the gate region 76 and the implantation of phosphorus in the region 88 to self-align the drain region 74 with the gate 76.

Figure 2L:
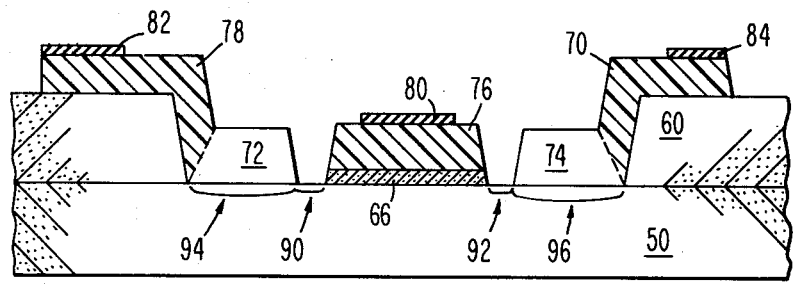

FIG. 2L illustrates the use of mask number four to define the windows where the subsequent metallurgy will contact the polysilicon region 68 for the source 72, the polysilicon region 70 for the drain 74, and the polysilicon region 76 for the gate. This technique is used in the recessed oxide process to contact the gate as disclosed by H. L. Kalter, et al in IBM TDB, Vol. 14, No. 10, March 1972.

Figure 2M:
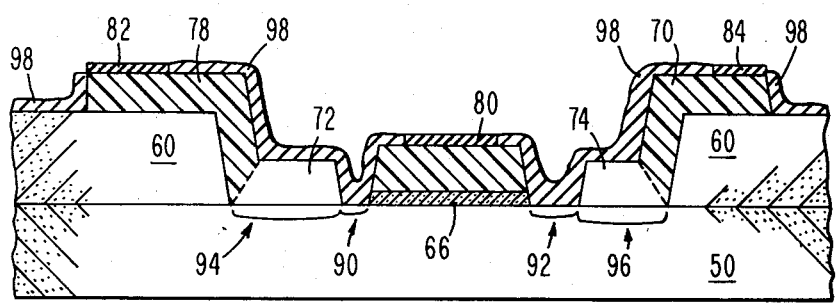

FIG. 2M illustrates the step of growing a silicon dioxide layer 98 in the range 1000A to 2000A in thickness to seal the silicon surfaces left exposed with masks three and four.

Figure 2N:
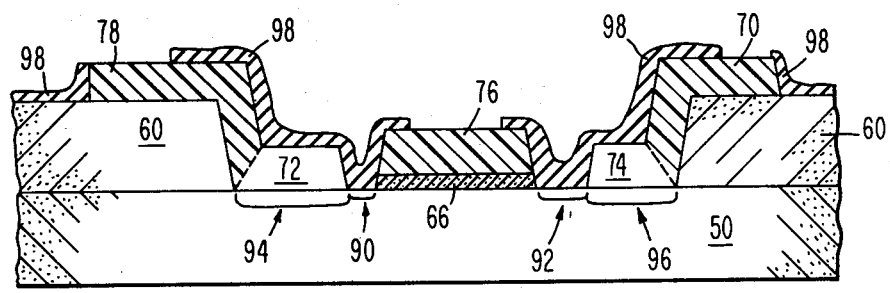

FIG. 2N illustrates the step of removing the nitride layers 80, 82 and 84 with a dip etch so as to expose contact regions for the drain 72, the gate 76, and source 74.

Figure 2O:
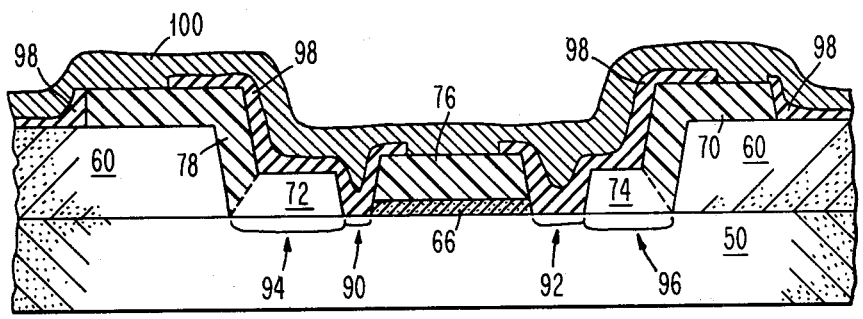

FIG. 2O illustrates the step of depositing the layer of aluminum 100 over the substrate to contact the windows described in FIG. 2L, thereby forming the self-aligned gate, source and drain contacts.

Figure 2P:
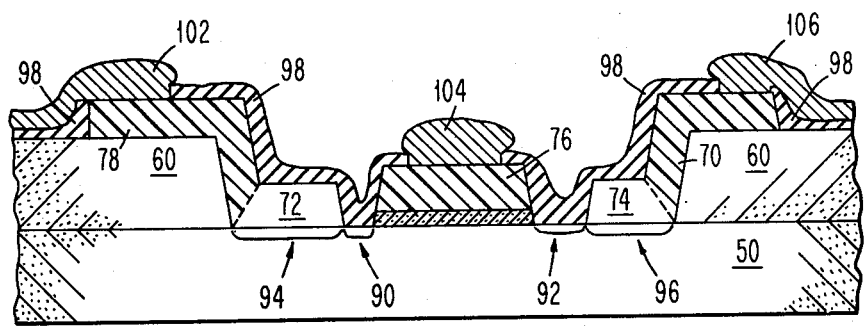

FIG. 2P illustrates the fifth and last masking step of defining the aluminum interconnection pattern in the aluminum layer 100 thereby defining the source metallization 102, the gate metallization 104, and the drain metallization 106. It should be noted that by placing the source contact 102 and drain contact 106 on top of the field oxide 60, no special metallurgy is needed to avoid aluminum spikes that may short out to the substrate 50. FIG. 2P illustrates the completed IGFET device with a field oxide.

In a manner similar to the polysilicon field shield process of FIGS. 1A–1K, the disclosed process for thermal oxide field region of FIGS. 2A–2P has the novel feature of decoupling the fabrication of the source and drain junctions 90 and 92, respectively, from their conductive interconnections 72 and 74, respectively, by using ion implantation for the former and epitaxial deposition for the latter. It is therefore possible to fabricate junctions and interconnections whose parameters are individually tailored for best device performance. The junctions are very shallow and have a lower junction capacitance than in the prior art since the side-wall junction capacitance is substantially reduced. The sidewall is now embedded in the oxide layer 98, which is a dielectric. In addition, since an epitaxial layer is used to form the protruding source and drain, the interconnections have low sheet resistivity, low isolation capacitance, and are deep enough for reliable metallurgy.

While the invention has been particularly shown and described with reference to the preferred embodiments thereof, it will be understood by those skilled in the art that the foregoing and other changes in form and details may be made therein without departing from the spirit and scope of the invention.

I claim:

1. A process for making an insulated gate field effect transistor device having shallow source and drain junctions, comprising the steps of:
   growing a first insulating layer of a first thickness on the surface of a silicon substrate of a first conductivity type;
   forming a first opening and a second opening spaced from said first opening in said insulating layer in the intended location for the source and drain respectively of the device;
   depositing a layer of silicon of a second conductivity type over the exposed surfaces of said insulating layer and said substrate;
   said silicon layer being formed in a polycrystalline phase in those regions lying over said insulating layer, with a first polysilicon region formed over the portion of said insulating layer between said first and said second opening and a second polysilicon region being formed over the portion of said insulating layer surrounding said first and said second openings;
   said silicon layer formed in an epitaxial monocrystalline phase in those regions lying over said exposed semiconductor substrate, with a first epitaxial region formed over said first opening and a second epitaxial region formed over said second opening;
   etching a first trough between said first polycrystalline silicon region and said first epitaxial silicon region and a second trough between said first polycrystalline silicon region and said second epitaxial silicon region;
   doping the surface of said substrate exposed by said first trough and said second trough with a dopant of said second conductivity type;
   growing a second insulating layer of a second thickness greater than said first thickness in said first and second troughs;
   forming electrical contacts with said first polycrystalline silicon region as a gate electrode, with said first epitaxial region as a source electrode, and with said second epitaxial region as a drain electrode;
   whereby an insulated gate field effect transistor device is formed in a process which decouples the fabrication of the source and drain P-N junctions from their conductivity interconnections.

2. The process of claim 1 wherein said step of growing the first insulating layer comprises thermally growing a silicon dioxide layer on said substrate.

3. The process of claim 1 wherein said step of doping comprises ion implanting the dopant in said substrate.

4. The process of claim 1 wherein said doping step comprises diffusing the dopant into said substrate.

5. The process of claim 1 which further comprises:
   following the step of depositing the layer of silicon, the steps of depositing a layer of silicon nitride over all exposed surfaces and patterning said silicon nitride layer by a first nitride etching step to form an etching mask for said first and said second troughs.

6. The process of claim 5 which further comprises:
after the step of etching said first trough and said second trough, a second nitride etching step for etching said silicon nitride layer so as to remove said nitride layer from said second polycrystalline silicon region.

7. The process of claim 6 which further comprises:
after said step of growing a second insulating layer, a third nitride etching step for
etching said silicon nitride layer remaining on said first polycrystalline silicon region, said first epitaxial silicon region, and said second epitaxial silicon region;
said second insulating layer being thermally grown silicon dioxide.

8. A process for fabricating an integrated circuit field effect transistor device having shallow source and drain regions, comprising the steps of:
growing a silicon nitride layer on the surface of a silicon substrate;
etching said silicon nitride layer so as to leave a first silicon nitride region and a second silicon nitride region spaced from said first silicon nitride region on the surface of said substrate;
growing a first thermal oxide layer on the exposed portions of the surface of said silicon substrate so as to form a first thermal oxide region surrounding said first and second silicon nitride regions and a second thermal oxide region between said first and said second silicon nitride regions;
etching said second thermal oxide region so as to expose the surface of said substrate beneath same;
growing a second, thin thermal oxide layer between said first and said second silicon nitride regions;
etching said first and said second silicon nitride regions so as to expose the surface of said silicon wafer thereunder as first and second window regions;
depositing a silicon layer on all exposed surfaces;
said silicon layer forming the polycrystalline silicon phase in those regions over said first thermal oxide layer and said thin thermal oxide layer;
said silicon layer forming a first epitaxial monocrystalline region over said first window region exposing said silicon substrate and a second epitaxial monocrystalline region over said second window region exposing said silicon substrate;
etching a first trough between said first epitaxial region and said thin oxide region and a second trough between said second epitaxial region and said thin oxide region;
doping the surface of said substrate exposed by said first and second troughs with a dopant of said second conductivity type;
growing a third thermal oxide layer thicker than said second thermal oxide layer, in said first and second troughs;
forming an electrical contact with each polycrystalline silicon region;
whereby an insulated gate field effect transistor is formed in a process which decouples the fabrication of the shallow source and drain junctions from their conductivity interconnections.

* * * * *